United States Patent [19]

Salensky et al.

[11] Patent Number: 5,045,141

[45] Date of Patent: Sep. 3, 1991

[54] METHOD OF MAKING SOLDERABLE PRINTED CIRCUITS FORMED WITHOUT PLATING

[75] Inventors: George A. Salensky, Whitehouse Station; Stephen B. Rimsa, Lebanon, both of N.J.

[73] Assignee: Amoco Corporation, Chicago, Ill.

[21] Appl. No.: 214,380

[22] Filed: Jul. 1, 1988

[51] Int. Cl.⁵ ............................................. H05K 1/09
[52] U.S. Cl. ................................. 156/240; 156/330; 252/511; 252/514; 29/829; 174/257
[58] Field of Search ............... 174/68.5, 257; 156/230, 156/231, 239, 246, 241, 249, 330; 427/96, 101; 252/514, 513, 511; 29/423, 424, 623.4, 527.1, 527.2, 829

[56] References Cited

U.S. PATENT DOCUMENTS

| | | | |
|---|---|---|---|
| Re. 30,274 | 5/1980 | Bolon et al. | 174/68.5 |
| 2,721,152 | 10/1955 | Hepf | 427/96 |
| 2,851,380 | 9/1958 | Berlinghof, Jr. | 427/96 |
| 3,013,913 | 12/1961 | Croop et al. | 428/328 |
| 3,374,110 | 3/1968 | Miller . | |
| 3,576,668 | 4/1971 | Fenster et al. | 427/96 |
| 3,589,962 | 6/1971 | Bonjour | 156/233 |
| 3,701,317 | 10/1972 | Miyamoto et al. . | |
| 3,703,603 | 11/1972 | Levesoque et al. | 427/96 |
| 3,729,819 | 5/1973 | Horie | 174/68.5 |
| 3,950,200 | 4/1976 | Muramoto et al. | 156/277 |
| 4,029,845 | 6/1977 | Nomura | 156/249 |
| 4,180,608 | 12/1979 | Del | 156/249 |
| 4,264,477 | 4/1981 | Seeger et al. | 252/511 |
| 4,327,124 | 4/1982 | Des Marais, Jr. | 427/96 |
| 4,329,779 | 5/1982 | England | 156/241 |
| 4,373,019 | 2/1983 | Watanabe et al. | 427/96 |
| 4,396,666 | 8/1983 | Ernsberger | 252/514 |
| 4,415,624 | 11/1983 | Prabhu et al. | 427/96 |
| 4,424,091 | 1/1984 | Mizuno et al. | 156/240 |
| 4,464,420 | 8/1984 | Taguchi et al. | 427/96 |
| 4,635,346 | 1/1987 | Matsuzaki | 156/241 |
| 4,803,543 | 2/1989 | Inayoshi et al. | 156/330 |
| 4,830,779 | 5/1989 | Maeno et al. | 252/513 X |
| 4,880,570 | 11/1989 | Sanborn et al. | 252/513 X |
| 4,929,388 | 5/1990 | Wessling | 252/511 X |
| 4,959,178 | 9/1990 | Frentzel et al. | 252/514 |
| 4,971,726 | 11/1990 | Maeno et al. | 252/511 |

FOREIGN PATENT DOCUMENTS

| | | |
|---|---|---|
| 0003364 | 8/1979 | European Pat. Off. . |
| 0130462 | 9/1985 | European Pat. Off. . |
| 0974919 | 1/1963 | United Kingdom . |

Primary Examiner—John J. Gallagher
Assistant Examiner—Mark A. Osele
Attorney, Agent, or Firm—Morgan & Finnegan

[57] ABSTRACT

Described herein is a composite structure comprising a dielectric substrate surface with an electrically conductive layer or pathway thereon. The pathway comprises a thermoset resin and sufficient electrically conductive metal, in the configuration of an electric circuit element, to provide desired properties and direct solderability. Direct solderability is achieved without plating the electric circuit element. It has a low surface resistivity, preferably less than 10 m ohm per square. Also described are conductive, thixotropic inks for printed circuit devices which include silver powder and silver flake in its composition. A thixotropic adhesive for bonding the electric circuit element to the dielectric substrate surface is also taught. A method for making the composite structure is further disclosed.

32 Claims, 1 Drawing Sheet

METHOD OF MAKING SOLDERABLE PRINTED CIRCUITS FORMED WITHOUT PLATING

FIELD OF THE INVENTION

This invention involves ink and adhesive compositions for printed circuit devices and methods using these compositions to make a printed circuit. The invention also relates to a printed circuit device.

RELATED APPLICATIONS

This application is directed to the production of printed circuits of the type disclosed in commonly assigned U.S. applications as follows: U.S. Ser. No. 508,056, filed June 24, 1983, now abandoned; U.S. patent application Ser. No. 616,239, filed June 5, 1984; U.S. patent application Ser. No. 516,689, filed July 25, 1983, now abandoned; U.S. patent application Ser. No. 516,677, filed July 25, 1983, and U.S. Ser. No. 15,646, filed Feb. 17, 1987, all hereby incorporated by reference.

BACKGROUND OF THE INVENTION

Printed circuits often have to meet certain requirements. They should have the capability of being wettable by solder so that a good bond between a circuit and its lead is made. Because they must be handled, the printed circuits should have good adhesion to a substrate. The circuit should have good electrical conductivity. Moreover, fabrication of a device using the printed circuit should facilitate manufacturing, for example, a process eliminating plating the circuit prior to soldering.

There are many processes known for making printed circuits or printed circuit boards. However, each process that is discussed below is disadvantageous in one or more respects.

U.S. Pat. No. 4,396,666 describes a method of painting an epoxy composition containing 65-85 percent by weight of a solderable metal powder onto a substrate and then slightly pyrolytically decomposing the cured epoxide to expose sufficient metal for soldering. This method suffers from some obvious deficiencies. One apparent deficiency is that the decomposition of the resin can be irregular, and the exposed surface of the circuit will also be irregular. Another deficiency is that expulsion of volatile matter from the circuit will open up the surface to crater formations, pits and the like, which could adversely affect the integrity of the circuit. Also, pyrolytic decomposition can attack the integrity of the film and especially the binder portion. Thus, adhesion of metal particles to the substrate would be suspect after decomposition. Because pyrolytic temperatures are great, at least 200° C., substantial damage to the substrate would occur if it were made of a thermoplastic material.

Japanese patent application 56,357/73 (published Jan. 26, 1981, Publication No. 2,435/81) describes printing a circuit pattern with a conductive ink on a transfer paper and then bringing the printed surface of the transfer paper into contact with a board for instant thermocompression bonding. The pattern is formed by a screen printing process onto the transfer paper. The application cites the following advantages for this process, including simplicity, accuracy, uniformity, non-polluting steps, recycling of poorly formed boards and manufacturing versatility. In attempts to follow the procedure of the Japanese patent, there are problems in obtaining transfer of printed circuit to dielectric surface; and resultant products can be lacking in desired parameters of conductivity, solderability and/or plateability.

The ink used in the Japanese application contained silver suspended in a solvent containing solution of a thermoplastic copolymer. Example 1 uses a vinyl chloride-vinylacetate copolymer and Example 2 uses an "acrylic resin" with no description of its composition. In Example 1, the "silver powder" comprises 89.47% of the solids weight of the composition; and in Example 2, it comprised 88.09% of the solids weight of the composition. The reference states that good plateability, easy soldered circuits and good adhesion are obtained. However, the reference fails to state the kind of circuit board that was used.

Though the technique of the Japanese application may be capable of transfer of the circuit to the board, the technique is disadvantageous. The amount of thermoplastic resin in the ink can cause the resin to coat the metal sufficiently to adversely affect soldering, wettability and electroless plating of the circuit. In addition, use of a thermoplastic resin limits effective soldering of the circuit and significantly limits the technology to soldering techniques that are not current state-of-the-art methods.

Another technique is the dusting method of U.S. Pat. No. 4,327,124. There a phenolic thermosetting resin (B-stage) is loaded with copper powder to achieve 70-75% loading. This is silk screened onto a board to form the circuit pattern. Then, copper powder is dusted onto the print of wet resin film. The film is cured and treated with solder. As with other techniques, disadvantages exist.

Because dusting of copper powder is an awkward process which gives no assurance of uniform metal distribution, the use of copper powder per se is a questionable selection in view of its propensity to form a non-conductive oxide as it ages. Metal powders of metals which form oxides more readily form oxides because of increased surface area provided by the powder.

Other techniques are known where 90% by weight or slightly higher of silver particle-containing inks are known for certain circuit pattern uses. See U.S. Pat. No. 4,264,477.

Certain methods of applying circuit elements to a substrate are known in the art. U.S. Pat. No. 4,329,779 teaches a method of applying circuit elements by direct contact transfer. The reference shows laminating elements of a circuit on a carrier layer by applying adhesive between the circuit and a substrate without compaction and without using heat sensitive bonding pastes or inks. The circuit element is formed by thin film fabrication techniques. Thus, the patent relates to a different technology than that utilized and discovered by applicant. This involves deposition in a vacuum of thin films of conductive, resistive or insulating materials by sputtering, evaporation, or chemical vapor deposition. According to the reference, the technique differs from thick film technology which can involve the use of pastes or inks like the present process. Overall, the reference shows laminating elements of a circuit on a carrier layer by applying adhesive between the circuit and a dielectric surface, bringing these together under pressure, bonding to form a composite structure and subsequently removing the carrier layer. Bonding in the reference is preferably by ultrasonic bonding.

U.S. Pat. No. 4,029,845 relates to a thermosetting resin in the use of heat and pressure to form a composite circuit board. The reference only discloses forming the baseboard and does not teach forming printed circuit elements on that baseboard. The reference refers to an additive process for manufacturing a printed circuit board without clear explanation of that teaching.

U.S. Pat. No. 4,180,608 teaches heat and pressure used to form a composite printed circuit board. However, the reference uses a carrier layer for resin but not for particle loaded ink as in the present invention. A lamination is formed as taught in the art.

U.S. Pat. No. 4,373,091 teaches thick film pattern forming methods. The reference discusses applying the paste directly to printed circuit boards. However, it is conventional to apply conductive inks and inks which can be plated to printed circuit boards in the form of circuit patterns.

U.S. Pat. No. 3,950,200 describes a method of fabricating a thermal printing head by printing a circuit pattern of resistive elements with electric conductors on one surface of a flat paper sheet, covering the circuit pattern with a carrier layer of resin, peeling off the flat paper sheet and placing the remaining carrier layer carrying the circuit pattern over a surface of insulating substrate. The circuit pattern is laid downward, and the carrier layer is heated. This causes the carrier layer to be burned off and causes the circuit pattern to adhere to the substrate. The method further requires use of an adhesive adjacent to the paper sheet. The circuit pattern is printed on the adhesive. A carrier layer then is formed on the circuit pattern, and the paper sheet is peeled off. The method is used with a ceramic substrate. The process is cumbersome and duplicative.

U.S. Pat. Nos. 4,424,091 and 4,464,420 teach conventional plating subsequent to producing a conductive pattern. Similarly, electroless plating is known in the art, that is, deposition of a metal coating by immersion of a metal or a non-metal in a suitable bath containing a chemical reducing agent. These plating techniques are utilized by the prior art to effect soldering of connections to the printed circuit. This additional processing step complicates processing and manufacturing of printed circuit articles. While such a process is necessary in the prior art, it is advantageously avoided by applicants' process. This achievement by applicants points up one of the novel aspects of the present invention to be discussed in greater detail below.

However, none of such known techniques obtain the advantages of the present invention. All the preceding references are hereby incorporated by reference.

SUMMARY OF THE INVENTION

The invention relates to a transfer article suitable for transferring a directly solderable electrically conductive circuit to a dielectric substrate, comprising an unplated, solderable electric circuit element deposited on a solid release surface, the circuit element containing a thixotropic thermosetting resin composition comprising (i) thermosetting resin and (ii) electrically conductive metal including a metal powder and high surface area metal flake whereby the electric circuit element exhibits superior metal dispersion, smoothness, and printability compared to those fabricated using non-thixotropic thermosetting resin compositions.

The invention further relates to a thixotropic printing ink comprising in admixture (i) a thermosetting resin in an amount of about 15 to about 37 percent volume fraction and (ii) an amount of electrically conductive metal powder and high surface area metal flake from about 63 to about 85 percent volume fraction of the dried ink, the ink being suitable for printing and on compacting and curing forming an unplated electric circuit element that can be soldered.

The invention also relates to a thixotropic adhesive comprising an admixture of polyhydroxyether and melamine formaldehyde.

The invention further relates to a process for forming a directly solderable printed circuit article which comprises:

(1) providing a release surface;

(2) applying an ink comprising a thixotropic thermosetting resin composition containing a desired amount of an electrically conductive metal powder and high surface area metal flake to the release surface in the configuration of an unplated, solderable electric circuit element;

(3) drying the ink;

(4) printing in registration with the ink circuit element a reactive thixotropic adhesive interface capable of interacting with the thermosetting resin composition of step (2) and a dielectric surface;

(5) drying the thixotropic adhesive;

(6) bringing together the release surface and the dielectric surface so that the unplated, solderable electrical circuit element is facing the dielectric surface and is separated therefrom by the adhesive interface; and (7) applying sufficient heat and pressure to form a composite structure whereby the thermosetting resin is cured and the adhesive is interacted whereby the electrical circuit element is transferred from the release surface to become bonded to the dielectric surface.

The invention also relates to a directly solderable printed circuit article comprising:

(a) a solid dielectric support surface; and (b) a first pathway on the surface comprising a thixotropic thermoset resin and electrically conductive metal powder and high surface area conductive metal flake configuration of an unplated solderable electric circuit element bonded to the support surface using a thixotropic adhesive printed on the pathway in registration, whereby the electric circuit element exhibits superior metal dispersion, smoothness, and printability compared to those fabricated using non-thixotropic thermosetting resin.

BRIEF DESCRIPTION OF THE DRAWINGS

This invention will now be described with respect to drawings which depict certain embodiments of the present invention. These drawings are exemplary only. They are not considered to limit the invention.

DETAILED DESCRIPTION OF THE INVENTION

The present method relates to manufacture of printed circuitry without using a plating step to make the circuitry solderable. The method utilizes conventional thick film printing techniques to image circuit patterns on a release substrate for subsequent adherence to a molded substrate. The method utilizes a new conductive ink and a new adhesive which obviates the need for a plating step required by other processes to make the circuitry solderable. These materials used with a transfer process provide a metal rich surface suitable for conventional soldering.

Conventional polymer thick film ink systems are widely used and well understood. The most common utilization of these systems is their use in membrane keyboards. The binder used in these systems can be thermoplastic or thermoset resin. The systems utilize high loadings of metallic filler. However, the concentration of metal is not sufficient to provide a conductor that can be directly soldered using conventional methods. Moreover, binder concentrations utilized in prior art systems provide inadequate bonding strength for the ink system. All these disadvantages have been overcome by the present invention which utilizes a new ink composition or system and a new adhesive to facilitate manufacturing of printed circuit devices.

To best appreciate the significant development of the present invention, it is useful to describe an earlier transfer process which provides a basis for comparison with the present invention.

PRIOR TRANSFER PROCESS

The following ingredients are blended together. The ingredients comprise an epoxy novolac resin and a polyvinyl formal resin solution. To this mixture is added silver particles, having a particle size of 2 to 12 microns, an apparent density of 21.5 to 23.5 grams per cubic inch, a tap density of 1.5 to 2.5 grams per cubic inch, a weight loss at 1,000° F. of approximately 1% and a nickel powder which is about 100% spherical having an average particle size of 12 microns and an apparent density of 56.8 grams per cubic inch. This mixture comprises a non-thixotropic conductive ink. The conductive ink is screen printed using conventional techniques onto a release paper to a thickness of approximately 1 mil after drying. The printed paper is dried. A substrate is molded from a composition containing polyarylsulfone. The substrate composition is compression molded to form a sheet. The substrate sheet is washed with isopropyl alcohol. Then, earlier adhesive shown on page 27 is applied and dried. The adhesive contains a polyvinyl formal part, allyl phenol formaldehyde, melamine formaldehyde, and a non-ionic surfactant which is a liquid fluorinated alkyl ester. The prepared adhesive is "window" screen printed onto the substrate sheet and dried but not fully cured. The printing is done using an open screen without a pattern and is not done in registration. The printed release paper is contacted with the adhesive coated substrate so that the printed surface contacts the adhesive surface of the substrate sheet and then laminated at appropriate temperature and pressure. The release paper is then stripped away from the assembly. The substrate is further heated.

The printed substrate is then pretreated with a solution of sulfuric acid and rinsed. The printed substrate is copper plated with electroless copper and then electroless nickel plated to deposit a nickel plate onto the exposed ink surface.

This earlier process is indicated to have maximum surface resistivities up to 0.5 ohm/sq. for unplated circuits, although preferably from 0.1 ohm/sq. to 0.05 ohm/sq. and sometimes as low as 0.03 ohm/sq. when conductive metal content is between 94 and 98 percent of the total metal content in the pathway or, expressed in another way, from about 68 to about 87 percent of the volume fraction based upon the volume of the dry film of the ink.

In summary, the earlier process comprises providing a release surface and applying to it an ink comprising a non-thixotropic thermosetting resin composition. The ink composition contains a desired amount of electrically conductive silver particles and nickel powder. The ink composition is formed as a film in the configuration of an electric circuit element. A reactive adhesive interface capable of interacting with the thermosetting resin composition and a substrate is also provided. The release surface with the film of electrical circuit element is brought together with a surface of the substrate coated with a non-thixotropic adhesive interface. These are heated and compressed whereby the electrical circuit is transferred from the release surface to the surface of the substrate. Then, the electrical circuit is plated so that electrical leads can be soldered to the circuit.

INVENTIVE TRANSFER PROCESS

The present invention distinguishes from this prior process by utilizing a different thixotropic conductive ink composition and thixotropic adhesive. These compositions eliminate plating the electric circuit so that it is solderable, that is, makes a directly solderable circuit to facilitate connection with additional circuitry.

It is applicants who have discovered printing a new conductive ink on a release medium, which can be a release paper, in a form of a solderable electrical circuit which is then preferably overcoated in registration with a new adhesive for subsequent transfer to a substrate. This article can be directly soldered unlike earlier articles.

The process is depicted in the following flow chart.

| INVENTIVE TRANSFER PROCESS FLOW CHART |
| --- |
| (1) Print Circuit On Releasable Medium |
| (2) Dry Circuit |
| (3) Print Adhesive On Circuit |
| (4) Dry Adhesive |
| (5) Prepare Substrate |
| (6) Transfer Circuit To Substrate |
| (7) Oven Cure Substrate Article With Transferred Circuit |
| (8) Apply Flux To Circuit Article |
| (9) Pre-heat Circuit Article |
| (10) Solder Circuit Article |

After the conductor is printed and dried on the release paper, an adhesive is applied, preferably in registration, over the printed conductor. The release paper with the printed circuit and the adhesive is dried. Drying can be done at 96° C. in a forced circulation oven for ten minutes to evaporate solvent in the printed ink circuit. A conveyor oven or infrared oven is used to reduce drying time. This provides the required cure for adhesion development to the substrate during the transfer step. About three minutes are needed for this step. The adhesive complements the ink, that is, it is formulated to chemically interact with the ink and the binder used in the ink formulation.

Optionally, the substrate, which is typically a circuit board, may be treated to faciliate transfer of the printed circuit to it. The surface of the substrate is prepared essentially instantaneously. Hot solvent vapors melt or plasticize and reflow the surface of the substrate. This effects clarity in surface finish. Further, no stress cracking of the substrate is apparent using this process. In vapor polishing, the substrate surface to be treated is exposed to vapors of a solvent. The surface is exposed to the vapors usually in a container, so that the entire surface area is contacted by the vapors. The solvent may include methylene chloride, chloroform, carbon tetrachloride, trichloroethane, trichloroethylene, trichloromethylene, a dichlorobenzene, acetone, methyl ethyl ketone cyclohexanone, ethyl acetate, demethyl acetamide, N-methyl pyrolidone, N,N dimethyl formamide, etc., with methylene chloride being preferred. The surface is contacted until a desired surface finish is obtained. This contact time is between 0.5 and about 3 seconds. Vapor polishing the substrate with methylene chloride for about one second is preferred. The board can also be immersed in a chlorinated-type solvent to get a uniform substrate surface.

Thereafter, the conductive ink and the adhesive are transferred to the substrate. This is done using heat and pressure for three minutes. During the transfer process, the adhesive substrate surface and ink binder all partially chemically react to form a permanent thermally resistant bond. Then, the circuit/substrate unit or article is heated for about 30 minutes at 150° C. to cure it further.

Afterwards, flux is applied to the circuit and the article is preheated. Then, the circuit is soldered to connect electrical leads to the circuit. Soldering can be done using a conventional wave solder technique at about 6 ft/min and at 475° F. solder bath temperature, using a preheat temperature of 275°-280° F. as measured on the top of the circuit board with a thermocouple.

Overall, the processing conditions are conventional to those skilled in the art. With that in mind, it is appropriate to discuss the new thixotropic conductive ink used in forming the directly solderable printed circuit and the new thixotropic adhesive used to connect the circuit with the substrate.

SOLDERABLE THIXOTROPIC CONDUCTOR

The ability of metals to conduct electricity is known. When a metal is capable of being converted to its oxide in air, its ability to conduct electricity is dependent upon its degree of oxidation to the oxide. The oxide form is non-conductive. When the same metal is comminuted, there is more surface area available for reaction with oxygen. Thus, the particles become more readily non-conductive. Consequently, the desired particulate metals, when used for electrical conductance, are those which are relatively inert to oxygen, such as the noble or precious metals, e.g., silver or gold or the like.

This invention does a number of remarkable things. It permits binding the electrically conductive metal so that the volume fraction taken up by the metal represents a large portion, indeed a major portion, of the electric circuit element. In the preferred embodiment, the volume fraction of the metal is at least about 54 percent and preferably at least about 63-85 percent of the volume of the electric circuit element on a dried basis. This can translate to a solids weight percent of the thermosetting resin composition of at least 90 percent, preferably at least about 94 percent, and most preferably at least about 95 percent, to a maximum of about 98 percent. Generally, the greater the electrically conductive metal concentration, the greater will be the electrical conductivity of the electric circuit element.

INK CONDUCTOR

This invention permits the metal to be sufficiently exposed at the surface of the circuit pathway without the need to degrade the resin binder. It has been determined that two physically different forms of silver achieve the desired level of conductivity and provide a directly solderable surface. For example, by using high metal loadings for this invention, a mixture of about 5% by weight is silver flake and about 95% by weight is silver powder.

The two forms include a metal powder and a metal flake, preferably of silver metal. The preferred silver powder is a high conductivity, densified, de-agglomerated, easily dispersed powder made by Metz Metallurgical Corporation. The preferred silver flake is a high surface area silver flake also made by Metz Metallurgical Corporation. This flake is very thin and has low bulk density with small particle size. It is made using a precipitation (chemical) process rather than using a conventional ball milling (physical) process. The properties of these silver materials are set out below:

| Properties For Silver Conductor Pigment | | |
| --- | --- | --- |
| Silver Powder EG-200 ED by Metz Metallurgical Corp. | | |
| Apparent Density (Scott) | 50 | g/in$^3$ |
| TAP Density | 4.3 | g/cc |
| Sub Sieve Size (Fisher) | 3 | micron |
| Surface Area (BET) | 0.1 | m$^2$/g |
| Ignition Loss at 110° C. | 0.08% | |
| at 538° C. | 0.61% | |
| Particle Size Distribution | 90% | 11.6 micron |
| (Leeds & Northrup Microtrac) | 50% | 6.3 micron |
| Silver Flake 50-S by Metz Metallurgical Corp. | | |
| Apparent Density | 2-4 | g/in$^3$ |
| TAP Density | 0.2-0.4 | g/cc |
| Sub Sieve Size (Fisher) | 0.10-0.20 | micron |
| Surface Area (BET) | 4.0-4.7 | m$^2$/g |
| Ignition Loss at 177° C. | 0.1% | |
| at 538° C. | 2.0% | |
| Particle Size Distribution | 90% | 12.7 micron |
| (Leeds & Northrup Microtrac) | 50% | 5.5 micron |

The electric circuit element of this invention is directly wettable by solder.

BINDER

Advantages of this invention are achieved by separating the function of binder as used in previous ink deposited printed circuits. Instead of having the binder for the electrically conductive metal particles function as an adhesive to the substrate surface, this invention tailors it solely for holding the silver metal together in the form of an electric circuit element. The binder according to this invention permits more complete transfer of an electric circuit from a release paper, permits solder to wet the conductive metal of the circuit directly, and effects greater bonding strength of the conductive metals.

The metal and binder are blended to produce a mixture containing the uniquely high electrically conductive metal loadings. This is considered a unique and unobvious composition.

This composition is made more unique by making the resin binder one which, during curing, crosslinks into a thermoset condition. It is thus called a "thermosetting resin" because it can thermoset or be in a thermoset condition. Thus the composition comprises the high volume loading of the conductive metal in a thermosetting binder. When cured, the binder improves bonding strength holding the resin particles together to make a more superior electric circuit element that can be directly wetted with solder.

THERMOSETTABLE RESINS

A detailed discussion of these resin binders for use in the ink composition is set forth in the disclosures of the related applications listed above, which are incorporated by reference. Specific thermosettable resins which are suitable for use in this invention are described in U.S. Pat. No. 4,715,977, hereby incorporated by reference. The resin binder disclosed in that patent is a polyhydroxyether, known as phenoxy resin. This resin is sometimes referred to as "thermoplastic polyhydroxyether."

The terms "thermoplastic polyhydroxyether" and "phenoxy" refer to substantially linear polymers having the general formula:

[—D—O—E—O—]$_n$ wherein D is the radical residuum of a dihydric phenol, E is an hydroxyl-containing radical residuum of an epoxide and n represents the degree of polymerization and is at least 30 and is preferably 80 or more. The term "thermoplastic polyhydroxyether" is intended to include mixtures of at least two thermoplastic polyhydroxyethers. In general, the polymer should have a molecular weight of about 15,000 to about 45,000, preferably about 22,000 to about 37,000 and ideally about 30,000.

The preferred polyhydroxyether is available commercially as UCAR Phenoxy PKFE, a trade designation of Union Carbide Corporation for a condensation polymer derived from bisphenol-A (2,2-bis(p-hydroxyphenyl)propane and epichlorohydrin having the structural formula:

Particularly preferred is a low volatile grade of phenoxy called UCAR Phenoxy PKFE.

The phenoxy resin is available as a solution in glycol ether esters such as Cellosolve acetate (the acetate of a monoalkyl glycol ether sold under the Trademark Cellosolve by Union Carbide Corporation) or in pellet form which is readily soluble in a variety of solvents and solvent blends. The solid phenoxy resin sold under the designation PKFE by Union Carbide Corporation is soluble in the following solvents: butyl Carbitol, butyl Carbitol acetate, butyl Cellosolve, Carbitol solvent, Cellosolve acetate, Cellosolve solvent, diacetone alcohol, diethyl Carbitol, dimethylformamide, dimethyl sulfoxide, dioxane, ethoxy triglycol, mesityl oxide, methyl Cellosolve acetate, methyl ethyl ketone, and tetrahydrofuran.

Cabitol is a Trademark of Union Carbide Corporation for the monoalkyl ether of diethylene glycol.

The preparation of the above-described polyhydroxyethers is described in U.S. Pat. No. 3,305,528, hereby incorporated by reference.

In addition to these polyhydroxyethers one may also use the linear thermoplastic polyethers described in U.S. Pat. Nos. 3,177,089, 3,306,872, and 2,602,075, hereby incorporated by reference.

The preferred crosslinking agent is a cycloaliphatic epoxy resin also made by Union Carbide Corporation. It is known as ERL-4221. These are described in U.S. Pat. No. 3,635,860, hereby incorporated by reference.

Critical to the composition is that it be thixotropic, that is, have a 2.5/20 rpm viscosity ratio greater than 2.5, and a viscosity greater than about 10,000 cps when determined with a Brookfield RVT Viscometer at 24° C. using a number six spindle at 20 rpm.

Typical conductor formulations follow and compare the directly solderable conductor of the present invention with an earlier conductor which requires plating to achieve solderability:

| | CONDUCTOR FORMULATION | | |
|---|---|---|---|
| TRADE NAME | CHEMICAL NAME | NON-SOLDERABLE (WT %) | SOLDERABLE* (WT %) |
| FORMVAR 5/95E | POLYVINYL FORMAL | 1.68 | — |
| DEN 431 | EPOXIDIZED NOVOLAC | 2.55 | — |
| PHENOXY PKFE | POLYHYDROXYETHER | — | 1.81 |
| EPOXY ERL-4221 | 3,4 EPOXY CYCLOHEXYL METHYL 3,4 EPOXY CYCLOHEXYL CARBOXYLATE | — | 2.75 |
| NOVAMET | NICKEL POWDER | 59.46 | — |
| SILFLAKE 135 | SILVER FLAKE | 21.24 | — |
| METZ EG200ED | SILVER POWDER | — | 82.62 |
| METZ 50S | HIGH SURFACE AREA SILVER FLAKE | — | 4.35 |
| DBE | DIMETHYL GLUTARATE | 12.06 | — |
| NMP | N-METHYL-2-PYRROLIDONE | 3.01 | — |
| BUTYL CARBITOL ACETATE | DIETHYLENE GLYCOL MONO BUTYL ETHER ACETATE | — | 8.47 |
| | Total | 100% | 100% |
| Electrical Conductivity | | 36 m ohm/sq. | 6 m ohm/sq. |

| | -continued | | |
|---|---|---|---|
| | CONDUCTOR FORMULATION | | |
| TRADE NAME | CHEMICAL NAME | NON-SOLDERABLE (WT %) | SOLDERABLE* (WT %) |
| (As transferred, no overplate) | | | |

*With 62Sn/36Pb/2Ag ALLOY Solder

The Brookfield viscosity of the above conductor formulations is measured using a RVT Viscometer at a temperature of 24° C. Using a number 6 spindle at 20 rpm, the viscosity range of the solderable conductor formulation is 35,750 cps. The 2.5/20 rpm viscosity ratio, which is an indication of shear stress or thixotropy, is 3.4 for the solderable formulation. The viscosity of the non-solderable conductor formulation is 23,125 using a number 4 spindle at 20 rpm. The viscosity ratio is 2.5 for that latter formulation.

This new solderable conductor exhibits superior metal dispersion, smoothness, and printability compared to known conductors. This conductor unexpectedly achieves an electrical conductivity (resistivity) of less than 10 m ohm/sq. This is pointed out in the above tabulation of a conductor formulation and properties of a transferred, unplated printed circuit made from that formulation.

MAKING THIXOTROPIC CONDUCTOR

The solderable conductor is prepared by dissolving the phenoxy resin in diethylene glycol monobutyl ether acetate with high speed agitation until all of the resin is dissolved. The crosslinking agent or epoxy resin is added to the agitated resin mixture and agitation is continued. Then the silver powder is added to the liquid resin mixture under high speed agitation. Once all of the powder is dispersed to a Hegman grind of six, the silver flake is added. This conductor formulation is mixed about ten minutes and vacuum deaerated. The finished dispersion should have a Hegman grind of six or better. The conductor is usually finished on a three roll mill dispersing unit to consistently attain a Hegman grind of six or better on a production basis. The viscosity of the conductor formulation should be between about 10,000 cps and 100,000 cps, preferably between about 25,000 cps and 50,000 cps when determined with a Brookfield RVT Viscometer at 24° C. using a number six spindle at 20 rpm. A desired 2.5/20 rpm viscosity ratio is between about 2.5 and 8 and preferably between about 3 and 5.

Agitation can be achieved using a Premier Mill Company Dispersator.

The conductive metal and binder are mixed together in a high boiling solvent to form a slurry (the ink). Suitable solvents include cellosolve acetate, n-butyl carbitol, n-methyl-2-pyrrolidine, N,N-dimethyl formamide, dimethyl sulfoxide, diethylene glycol diethyl ether, diethylene glycol dibutyl ether, diethylene glycol dimethyl ether, ethylene glycol monoethyl ether, diethyl carbonate, ethylene glycol monomethyl ether, and the like. Diethylene glycol monobutyl ether acetate is preferred. The solvent is vaporized during curing.

The amount of resin in the ink on dry basis is about 5% by weight or essentially the remainder of the conductor formulation based upon the quantity of silver flake and silver powder included in the formulation. Thus, the amount of organic binder is the difference between 100% and the silver metal loading.

The electrically conductive metal is present in the slurry in amounts of at least 90, preferably from 94 to less than 100 and most preferably from about 94–95 to 98 percent on a 100% solids basis. This metal contact can achieve a surface resistivity for an unplated surface of less than 100 m ohm/sq., preferably less than 20 m ohm/sq., even less than 10 m ohm/sq., and sometimes less than 6 m ohm/sq. Of course, surface resistivity varies from the top side to the bottom side of the pathway, e.g. 20 m ohm/sq. on the top side and 6 m ohm/sq. beneath. The resistivities mentioned refer to the top side of the pathway.

To achieve the most desired level of conductivity, e.g., surface resistivity of less than 10 m ohm/sq., the conductive metal content should be between 94 and 98 percent of the total metal content in the pathway, or expressed in another way, from about 63 to about 85 percent of the volume fraction based on the volume of the dry film of the ink. The latter characterization is the more valid basis for describing the limits of metal content. This is so because when conductive metal coated dielectric core particles are used, the percentage by weight of metal does not determine electrical conductive properties. Rather, the volume fraction is determinative. However, where certain maximized solderability values and conductivity values are not required, some advantages of the invention can be obtained with metal volume fractions of as low as 54%.

RELEASE SURFACE

Next, instead of coating (or printing) the metal/binder composition onto a substrate or circuit board as is frequently done in the prior art, the composition is printed as a film onto a release surface that gently holds the composition in the desired circuit element configuration.

The resin/metal composition on the release surface is partially cured. This can be defined in another way. The resin is induced into a partial degree of crosslinking, oftentimes characterized as going from one stage to another, as an A-stage resin to a B-stage resin. This serves to adhere the particles into a unified film which can be handled sufficiently for transferring to a substrate surface.

The release surface which may be used herein is any surface which is suitable for accepting the conductive metal film which is applied thereto in the configuration of at least an electrical circuit element. The solid release surface may be a release paper, a film made from the plastics described above providing a release surface or a rigid plastic or metal release surface. Preferred release surfaces are release papers and include those formed from a silicone coated Kraft paper such as Stripkote (obtained from S. D. Warren Co., Westbrook, Maine).

ADHESIVE INTERFACE

In the practice of this invention, the bonding of the thermosetting film loaded with metal is achieved by creating a separate adhesive interface between the film and the substrate surface. The adhesive may be applied to the entire surface (window screen printing) which is to support the conductive pathway or only on the pathway, that is, in registration with it. The latter registration method is preferred. In another embodiment, the adhesive may be part of the structure of the substrate surface; e.g., it can be a thermosetting resin prepeg to which the thermosetting film is supplied. Then, they are bonded and cured together into an integrated composite structure.

Important to this invention is the kind of bond achieved between the thermosetting resin film to be transferred to the substrate surface, and the substrate surface. For this invention, that bond must withstand very severe conditions.

The adhesive component is blended so as to form a cured thermoset interfacial bonding layer between the adherend (the substrate surface) and the other adherend (the circuit element film). The theories underlying adhesion are discussed, see, e.g., Skiest, "Handbook of Adhesives," 2nd Ed., pp 11-16, Van Nostrand Reinhold Co. (1977), hereby incorporated by reference.

More particularly, the adhesive may be based on a polyhydroxyether such as Phenoxy PKFE sold by Union Carbide and modified melamine formaldehyde resin such as Resimene 2040 sold by Monsanto Chemical Co. Other melamine formaldehyde crosslinking agents like Cymel 303 and 325 can be used. The adhesive also includes diethylene glycol monobutyl ether acetate and a colorant, such as nigrosine black which is solubilized, for example, with benzoic acid. The composition includes a high surface area silica like Cabosil M-5 made by the Cabot Co. Suitable siliceous fillers include pyrogenic and precipitated silica having a surface area of about 50 to 300 m$^2$/g and more particularly of about 172 to 225 m$^2$/g. Other siliceous fillers include silane treated silicas and quaternary amine treated clays.

MAKING THE ADHESIVE

The polyhydroxyether or phenoxy resin is dissolved in the diethylene glycol monobutyl ether acetate using high speed mixing until all the resin particles are dissolved. The melamine formaldehyde resin is then added. The nigrosine black and benzoic acid are mixed together and then added with high shear agitation. The high surface area silica is then added with high shear mixing. The entrained air is removed with vacuum.

TRANSFERRING THE PRINTED CIRCUIT TO THE SUBSTRATE

The release surface and the substrate surface are contacted such that the electrical circuit is facing the substrate surface and is separated therefrom by the adhesive resin. Sufficient heat and pressure are applied to form a composite structure whereby the thermosetting resin is essentially fully cured, and the adhesive is essentially fully interreacted. Thus, the electrical circuit is transferred from the release surface to become bonded to the substrate surface. In some cases, only partial curing and/or reaction need be obtained. The release surface is then separated from the composite structure preferably to provide an electrical circuit having a surface resistivity of less than 10 m ohm per sq.

The release surface and the substrate surface are contacted at a temperature of from about 150° C. to about 190° C. and preferably 140° C. to 180° C. The surfaces are contacted at a pressure of from about 200 psi to about 1,000 psi and preferably 400 psi to 600 psi but not so great as to cause distortion of components. A pressure of 500 psi is preferred. Pressure can be applied for 1 to 5 minutes, preferably 3 minutes.

| ADHESIVE FORMULATION | | |
|---|---|---|
| CHEMICAL NAME | EARLIER (WT %) | NEW (WT. %) |
| POLYVINYL FORMAL | 13.90 | — |
| ALLYL PHENOLFORMALDEHYDE | 1.39 | — |
| MELAMINE FORMALDEHYDE | 1.04 | — |
| FLUORO ALIPHATIC ESTER | 1.39 | — |
| POLYHYDROXY ETHER | — | 18.99 |
| MELAMINE FORMALDEHYDE | — | 0.95 |
| DIMETHYL GLUTARATE | 65.82 | — |
| N-METHYL PYRROLIDONE | 16.45 | — |
| DIETHYLENE GLYCOL MONO BUTYL ETHER ACETATE | — | 75.97 |
| NIGROSINE BLACK | — | 0.19 |
| BENZOIC ACID | — | 0.05 |
| SILICA | — | 3.86 |

The Brookfield viscosity for the above new adhesive composition is measured using a RVT Viscometer at a temperature of 24° C. and is between 10,000 cps and 100,000 cps at 20 rpm using a number six spindle with a 2.5/20 rpm viscosity ratio of 4.25. The new adhesive has high thixotropy and high shear stress. The earlier adhesive composition has a viscosity between 3700 cps and 4000 cps using a number four spindle with a 2.5/20 rpm viscosity ratio of 1.08, all measured at the above conditions. The new adhesive composition has a viscosity range similar to that of the new conductive formulation, that is between 10,000 cps and 100,000 cps, preferably between 25,000 cps and 50,000 cps measured with a number six spindle at 20 rpm. The new adhesive composition has a desirable viscosity ratio between about 2 and 8, preferably between about 3 and 5.

In a preferred embodiment, when the multilayers are formed, they are subjected to sufficient pressure during curing to cause some compaction of the thermosetting film. This causes further densification of the circuit element, improving its conductive qualities. Such compaction is permanent in the structure of the film because the resin is thermoset in that condition. It has been noted that such compaction does not result in smearing of the film. Thus, the fine edges achieved in printing are maintained. Preferably, compaction of 25 to 40% of original printed pathway thickness is obtained.

This invention overcomes many deficiencies in printed circuitry of the past in terms of simplicity, ease of operation, functional utilization and performance. As seen from the foregoing, the invention relies upon the interfunctionality of the materials used to provide advantages not contained in prior art products and processes.

THE SUBSTRATE SURFACE

The substrate surface may be any known dielectric, that is, insulating or non-conducting substrate. The related applications referred to above provide a detailed list of suitable substrates which can be used in this invention. Preferred substrates will be taught below.

The ultimate performance of a polymer thick film conductor can be significantly effected by substrate selection. Conductive inks have historically been applied to a wide variety of insulating supports with an equally wide range of resultant performance. Less than optimal results may be obtained if the polymer thick film composition lacks chemical affinity for the substrate, exhibits a significant thermal expansion coefficient mismatch to the substrate, or if the level of thermal endurance displayed by the polymer thick film and substrate are imbalanced.

Thermoplastics, in general, exhibit a more complex range of chemical, thermal, and mechanical behavior than traditional thermoset printed wiring board laminates. This makes material selection for polymer thick film application even more critical. Evaluation of commercially available engineering thermoplastics as polymer thick film substrates revealed the need for an optimized injection moldable composition. Current resin systems typically exhibit one or two desired characteristics but in general lack the overall property balance to make them good polymer thick film support candidates. Resin deficiencies become readily apparent during assembly operations, in particular, wave or vapor phase soldering where substrate warpage, bubbling, dimensional instability and conductor delamination are common occurrences.

To address the need for an optimized polymer thick film substrate, applicants are using engineering resin called polyarylsulfone. These resins offer a highly desirable property balance for polymer thick film application where excellent dimensional stability, warp resistance and wave solderability are requirements. In addition, these resins exhibit true chemical compatibility with the polymer thick film adhesive system, displaying a synergistic effect between conductor and substrate, thereby enhancing ultimate performance.

Polyarylsulfone resins are characterized by inherently high heat distortion temperatures, excellent dimensional stability, creep resistance, low loss AC dielectric properties, and high mechanical strength as shown below.

| Typical Properties of Polyarylsulfone Resins | | |
|---|---|---|
| Property | Units | Typical Property |
| Tensile Strength | psi | 13,400 |
| Elongation to Break | % | 2.2 |
| Tensile Modulus | psi | 892,000 |
| Flexural Strength | psi | 19,300 |
| Heat Deflection Temperature | °C. | 215 |
| Density | gm/cc | 1.55 |
| AC Dielectrics | | |
| Dielectric Constant | | |
| 60 Hz | — | 3.86 |
| 1 KHZ | — | 3.85 |
| Dissipation Factor | | |
| 60 Hz | — | 0.0042 |
| 1 KHZ | — | 0.0035 |
| Dielectric Strength ⅛" specimen | Volts/mil | 398–550 |

| Typical Properties of Polyarylsulfone Resins -continued | | |
|---|---|---|
| Property | Units | Typical Property |
| Volume resistivity at 50° C. | meg ohm-cm | $0.41 \times 10^{11}$ |

INJECTION MOLDING

Polyarylsulfone resins are easily processed utilizing standard injection molding machinery and practice. Prior to molding, resins should be dried to obtain optimum performance in a dehumidified hopper drier or circulating air oven. Utilization of a hopper drier is preferred with an inlet air temperature in the 149°–163° C. (300°–325° F.) range and an outlet temperature not less than 135° C. (275° F.). When tray drying is utilized, pellets should be spread into a layer 1–2" in depth. It is important in all cases that the pellets reach and maintain a minimum temperature of 275° F. for 3–4 hours. Dried resin should be molded promptly and handled carefully to preclude moisture reabsorption.

The rheological characteristics of polyarylsulfone resins provide excellent flow for filling thin and intricate wall sections typically encountered in printed wiring boards, chip carriers, and related devices. The resins process readily at stock temperatures in the 680°–720° F. ranges (wave soldering grade). Mold temperatures of 230°–315° F. are used typically with the resin for wave solderable moldings. Clean polyarylsulfone resin scrap may be reground and utilized in fabrication, provided it is properly dried and kept free of contamination.

Polyarylsulfone produces warp-free moldings that are dimensionally stable both prior to and following the transfer process. Transferred circuitry exhibits tenacious adhesion to the resin as transferred, and maintains its adhesion following wave soldering.

POLYARYLSULFONE

Polyarylsulfone is the preferred thermoplastic polymer substrate of the invention. It is an amorphous thermoplastic polymer containing units of the formula:

(I)

, and

(II)

and/or (III)

wherein $R_{55}$ is independently hydrogen, $C_1$ to $C_6$ alkyl or $C_4$ to $C_8$ cycloalkyl, X' is independently wherein $R_{56}$ and $R_{57}$ are independently hydrogen or $C_1$ to $C_9$ alkyl, or wherein $R_{58}$ and $R_{59}$ are independently hydrogen or $C_1$ to $C_8$ alkyl, and $a_1$ is an integer of 3 to 8; —S—, —O—, or a is an integer of 0 to 4 and n is independently an integer of 1 to 3 and wherein the ratio of unit (I) to the sum of units (II) and/or (III) is greater than 1. The units are attached to each other by an —O— bond.

A preferred polymer of this invention contains units of the formula:

and

Another preferred polyarylsulfone of this invention contains units of the formula:

These units are attached to each other by an —O— bond.

The polyarylsulfone may be random or may have an ordered structure. The polyarylsulfones of this invention have a reduced viscosity of from about 0.4 to greater than 2.5, as measured in N-methylpyrolidone, or other suitable solvent, at 25° C.

The polyarylsulfones are prepared by a method described in the related applications.

Additives which may be used with the thermoplastic and/or thermosetting resin for making the dielectric substrate, as for example a printed circuit board, include reinforcing and/or non-reinforcing fillers such as wollastonite, asbestos, talc, alumina, clay, mica, glass beads, fumed silica, gypsum and the like; and reinforcement fibers such as aramid, boron, carbon, graphite, and glass. Glass fiber is the most widely used reinforcement in the form of chopped strands, ribbon, yarn, filaments, or woven mats. Mixtures of reinforcing and non-reinforcing fillers may be used, such as a mixture of glass fibers and talc or wollastonite. These reinforcing agents are used in amounts of from about 10 to about 80 weight percent, whereas the non-reinforcing fillers are used in amounts of up to 50 weight percent. Other additives include stabilizers, pigments, flame retardants, plasticizers, processing aids, coupling agents, lubricants, mold release agents, and the like. These additives are used in amounts which achieve the desired result.

INTENDED USE

The transfer of circuitry can be made to take place over planar or a three-dimensional substrates to the extent the surface is "developable". For example, a three-dimensional circuit can be transferred to an injection molded substrate.

Uses for the process are aimed at such three-dimensional type devices in high volume where the speed of the printing process and the efficiency of the use of injection molded substrate can be utilized cost-effectively.

Specifically, small planar or three-dimensional circuit boards can be efficiently produced using the process. Also, with some process modification, a series of molded plastic chip carriers can be tooled and produced. These leadless plastic chip carriers utilize a premolded thermoplastic substrate and a transfer process to apply the conductors, which are subsequently plated to accommodate wire bonding and soldering operations.

These chip carriers are manufactured from the same resin system that is used in the circuit boards; and when they are used together, there is not thermal mismatch between the chip carrier and the circuit board.

EXAMPLES

The invention will now be described with examples of the teaching set forth above. These examples are exemplary and not exclusive. They are not considered limiting.

Reference will now be made to the drawings. This will assist in appreciating the present process as well as the examples which will follow a discussion of the drawings.

Figure 1:
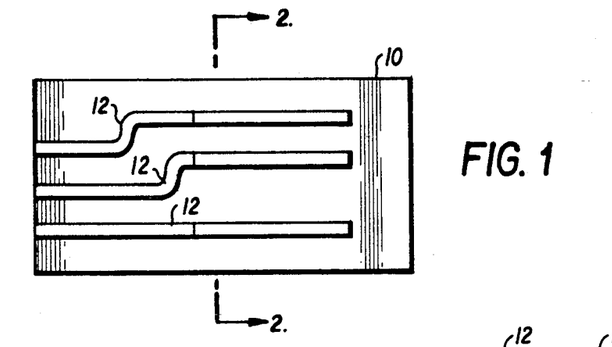
FIG. 1 is a top view of a circuit board embodying the invention.
Figure 2:
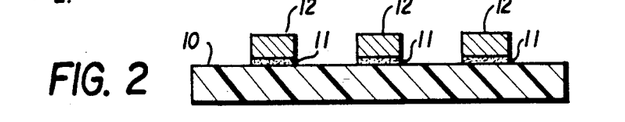
FIG. 2 is a sectional view taken along line 2—2 of FIG. 1.

In FIGS. 1 and 2, the dielectric substrate is shown at 10, the cured adhesive is shown at 11 and the electrical conductive pathways (electric circuit element) are shown at 12. In this figure, three pathways 12 are shown and form what is known as the conductive pattern (circuit pattern) of a printed circuit board to which components are connected.

Figure 3:
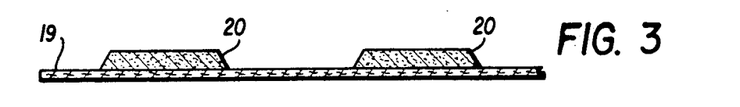
FIG. 3 is a side elevational view showing circuit lines (pathways) as an ink slurry on a transfer (e.g. peel-off) carrier layer.

FIG. 3 shows circuit pattern pathways to be formed on a removable layer 19. It is releasable so that it may be peeled away.

Figure 4:
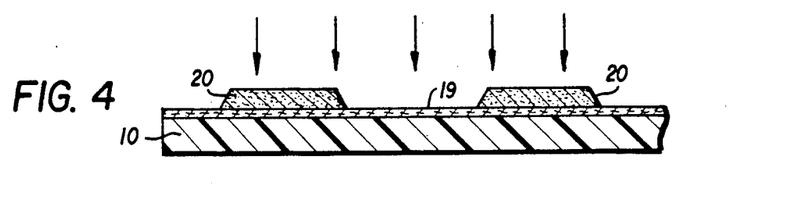
FIG. 4 is a view showing the use of heat to volatilize the solvent in the ink while on a support.

In FIG. 4, heat is used to boil off solvent to use the conductive pattern. The release layer 19 is shown positioned on a support 10.

Figure 5:
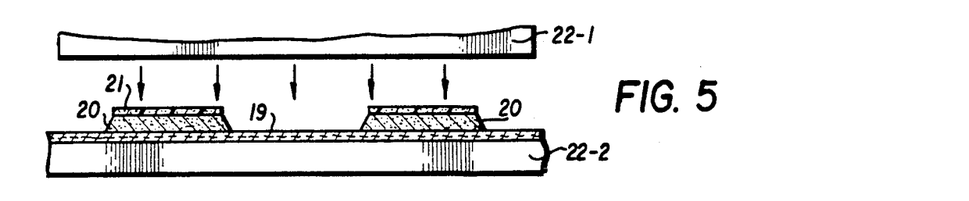
FIG. 5 is a view showing an adhesive applied in registrations over the pathways. The adhesive is dried before applying heat and pressure for transfer.
Figure 6:
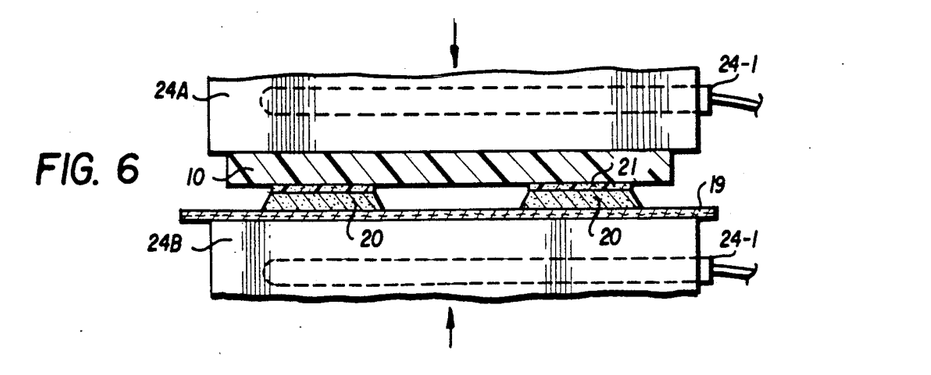
FIG. 6 is a view showing transfer of electrical pathways to a dielectric board while applying heat and pressure to further use and compact the pathways.

Thereafter, the metal in lines 20 may be compacted by applying pressure to increase conductivity. As mentioned, an adhesive 21 may first be applied in registration over lines 20. The adhesive is dried before applying heat and pressure to transfer and compact it. Then, the metal in lines 20 and the adhesive may be compacted by a press, comprising sections 22-1 and 22-2. Preferably sheets of silicone rubber (thermally conductive) 65 durometer are positioned on both sides of the material being compacted with the silicone rubber sheet in contact with the paper 19 and the adhesive 21 as shown in FIGS. 5 and 6.

Then, the release layer supporting the lines 20 and the adhesive 21 are positioned in a heated press comprising sections 24A and 24B, having heaters 24 -1. The press produces a temperature which is sufficient to cure the adhesive and the binder, and cause transfer of the adhesive to a substrate, e.g., plastic (dielectric layer) 10 to form a circuit article. In addition, the press causes a compacting of metal in the lines (electrically conductive pathways) 20. Typically, there is no embedding of the circuit lines 20 in the substrate 10, and the circuit lines or pathways 20 are directly on the surface of the dielectric substrate. The layer 19 is removed by peeling it off to leave a circuit article.

EXAMPLE 1

The following ingredients in percent by weight are blended together at room temperature using the procedure taught under the heading "Making Thixotropic Conductor":

(I) 1.81 percent polyhydroxyether known as Phenoxy PKFE,
(II) 2.75 percent 3,4 epoxy cyclohexyl methyl 3,4 epoxy cyclohexyl carboxylate known as epoxy ERL-4221, and
(III) 8.47 percent diethylene glycol mono butyl ether acetate known as butyl carbitol acetate.

To this mixture is added the following ingredients:
(IV) 82.62 percent of silver powder from Metz Metallurgical Co. known as METZ EG200ED; and
(V) 4.35 percent of silver flake also from Metz Metallurgical Co. known as METZ 50S More particularly, the phenoxy resin is dissolved in diethylene glycol monobutyl ether acetate with agitation. The epoxy resin is added to this mixture while agitation is continued. Then, silver powder is added to the mixture under continued agitation until it is dispersed to a Hegman grind of six. Then, the silver flake is added until it is also dispersed to a grind of six or better. The viscosity of the mixture is 35,000 cps. as determined with a Brooksfield RVT Viscometer at 24° C. using a number six spindle at 20 rpm. The 2.5/20 rpm viscosity ratio is 4. The conductive metal and binder are mixed together until completely homoginized to form an ink.

This conductive ink is screen printed (U.S. Sieve size 230), using conventional techniques, onto VNS Supermat release paper (obtained from S. D. Warren Co., Westbrook, Me.) to a thickness of approximately 1 mil after drying.

The printed paper is dried in a convective air oven at 96° C. for ten minutes.

A substrate is molded from a composition containing 78 weight percent of a polymer containing the following unit:

having a reduced viscosity of 0.61 dl/g as measured in N-methylpyrrolidinone (0.2 g/100 ml) at 25° C. The composition also contains 10 weight percent mica and 10 weight percent of 739 milled glass fibers obtained from Owens Corning.

The substrate composition is injection molded using the conditions set forth under the heading "Injection Molding". A 6×6 plaque which is 0.06" thick is molded. The melt temperature is 710° F., and the mold temperature is 305° F. The injection speed is 35 mm/sec, and the injection molding pressure is 100 bars for 7 sec.

The substrate sheet is vapor polished with methylene chloride for about one second.

Separately, an adhesive containing the following ingredients is prepared:

| TRADE NAME | CHEMICAL NAME | NEW (WT. %) |
|---|---|---|
| PHENOXY PKFE | POLYHYDROXY ETHER | 18.99 |
| RESIMENE 2040 | MELAMINE FORMALDEHYDE | 0.95 |
| BUTYL CARBITOL ACETATE | DIETHYLENE GLYCOL MONO BUTYL ETHER ACETATE | 75.97 |
| BLACK SAPL | NIGROSINE BLACK | 0.19 |
| BENZOIC ACID | BENZOIC ACID | 0.05 |
| CABOSIL | SILICA | 3.86 |

The ingredients are mixed together using the procedure taught under the heading "Adhesive Interface" and "Making the Adhesive". First, the polyhydroxyether and the butyl carbitol acetate are mixed together. Then, melamine formaldehyde is added to this mixture. Afterwards, the colorant, here nigrosine black dissolved with benzoic acid, is further added to this mixture. Then the high surface area silica is added. At all times, the mixture is agitated with high shear using a dispersator or like mixer. The viscosity of the adhesive composition measured with an RVT Viscometer at 24° C. using a number six spindle at 20 rpm is 35,000 cps with a 2.5/20 rpm viscosity ratio of 4.

The prepared adhesive is screen printed in registration on top of the conductor surface of the printed circuit which is already dried. Then, the adhesive coated circuit is placed in a convective oven at 96° C. for 10 minutes until the adhesive coat is dry but not fully cured. The substrate after being vapor polished with methylene chloride, is placed in a compression platen press with the release paper containing the conductor (1.0–1.2 mils dry film thickness) and the adhesive printed in the registration (0.6–0.8 mils dry film thickness). Then it is molded at 500 psi for 3 minutes at 350° F. after the release paper is stripped away.

The circuit board is then cured in an oven at 150° C. for 30 minutes. After cure, the board can be soldered with a hand soldering iron or in a wave solder machine set at 475° F. with a carrier speed of 6 ft/min. The electrical resistance of a square serpentine pattern was measured with a milliohm meter. Consistent values in the range of 5-10 milliohms/1 mil square are obtained.

For bond strength determination, copper wires (0.05/inch diameter) are soldered onto ¼ inch diameter pads of the circuit board. After cooling, the wires are pulled from the boards clamped onto the base of a Chatillon tensile tester Model UTSM. The wires are hooked onto the end of a AMETEK ACCU Force Gage II. The circuit board is then lowered at the #1 setting of the Chattilon tester, and the maximum force is measured to break the bond between the wire and the ¼ inch pad on a 1/16 inch substrate board. Consistent values in excess of 750 psi are obtained.

Although the invention has been described in conjunction with specific embodiments, it is evident that many alternatives and variations will be apparent to those skilled in the art in light of the foregoing description. This may include optionally plating the printed circuit even though the circuit is solderable without this treatment. Accordingly, the invention is intended to embrace all of the alternatives and variations that fall within the spirit and scope of the appended claims.

We claim:

1. A process for forming a directly solderable printed circuit article which comprises:
   (1) providing a release surface;
   (2) applying an ink comprising a thixotropic thermosetting resin composition containing a desired amount of an electrically conductive metal powder and high surface area metal flake to the release surface in a configuration of an unplated, solderable electric circuit element;
   (3) the thermosetting resin comprising a mixed resin composition of a cross-linkable resin and a thermoplastic resin possessing functionally reactive groups capable of reacting with functionally reactive groups in the cross-linkable resin;
   (4) drying the ink;
   (5) printing in registration with the ink circuit element a reactive thixotropic adhesive interface capable of interacting with the thermosetting resin composition of step (2) and a dielectric surface;
   (6) drying the thixotropic adhesive;
   (7) bringing together the release surface and the dielectric surface so that the unplated, solderable electrical circuit element is facing the dielectric surface and is separated therefrom by the thixotropic adhesive interface; and
   (8) applying sufficient heat and pressure to form a composite structure whereby the thermosetting resin is cured and the adhesive is interacted whereby the solderable electrical circuit element is transferred from the release surface to become bonded to the dielectric surface.

2. The process according to claim 1, wherein the release surface is removed from the composite structure and the thermosetting resin composition and adhesive are fully cured.

3. The process according to claim 2, wherein the volume fraction of metal is from about 63 to 85 percent and the volume fraction of thermosetting resin is from about 15 to 37 percent.

4. The process according to claim 3, wherein the electric circuit element is compacted by at least 25 percent.

5. The process according to claim 1, wherein the thermosetting resin is partially cured prior to contact with the adhesive.

6. The process according to claim 1, wherein the amount of metal in the thermosetting resin composition comprises from about 94 weight percent thereof up to about 98 weight percent thereof.

7. The process according to claim 3, wherein the resultant electrical circuit element is solderable.

8. The process according to claim 1, wherein the dielectric surface is a non-conductive plastic comprising a polyarylsulfone or a polyarylethersulfone which are reinforced with fillers and/or fibers.

9. The process according to claim 1, wherein the resin composition has a viscosity ratio of about 2 to about 8.

10. The process according to claim 9, wherein the resin composition has a viscosity ratio of about 3 to about 5.

11. The process according to claim 1, wherein the metal is silver.

12. The process according to claim 11, wherein the silver powder has an apparent density about 50 g/in$^3$, a TAP density about 4.3 g/cc, a surface area about 0.1 m$^2$/g and a particle size distribution of 90% 12.7 micron and 50% 5.5 micron.

13. The process according to claim 11, wherein the silver flake has an apparent density about 2 to 4 g/in$^3$, a TAP density of about 0.2 to 0.4 g/cc, a surface area about 4.0 to 4.7 m$^2$/g and a particle size distribution of 90% 12.7 microns and 50% 5.5 micron.

14. The process according to claim 1, wherein the adhesive has a viscosity ratio between about 2 and about 8.

15. The process according to claim 14, wherein the adhesive has a viscosity ratio between about 3 and about 5.

16. The process according to claim 1, wherein the resistivity of the circuit element is less than 100 m ohm/sq.

17. The process according to claim 16, wherein the resistivity of the circuit element is less than 10 m ohm/sq.

18. The process according to claim 17, wherein the resistivity of the circuit element is less than 6 m ohm/sq.

19. The process according to claim 1, wherein the dielectric surface comprises a thermoset polymer.

20. The process according to claim 1, wherein the dielectric surface comprises a thermoplastic polymer.

21. The process according to claim 1, wherein the dielectric surface is vapor polished.

22. The process according to claim 21, wherein methylene chloride is used to vapor polish the dielectric surface.

23. The process according to claim 1, wherein the thermoplastic resin is polyhydroxyether.

24. The process according to claim 1, wherein the cross-linkable resin is an epoxy resin.

25. The process according to claim 24, wherein the epoxy resin is 3,4 epoxy cyclohexyl methyl 3,4 epoxy cyclohexyl carboxylate.

26. The process according to claim 23, wherein the polyhydroxyether is a substantially linear polymer having the general formula $$[-D-O-E-O-]_n$$

where D is the radical residuum of a dihydric phenol, E is a hydroxyl-containing radical residuum of an epoxide and n represents the degree of polymerization and is at least 30.

27. The process according to claim 26, wherein the polyhydroxyether is a mixture of at least two thermoplastic polyhydroxyethers.

28. The process according to claim 26, wherein the polymer has a molecular weight from about 15,000 to about 45,000.

29. The process according to claim 28, wherein the polymer has a molecular weight from about 22,000 to about 37,000.

30. The process according to claim 28, wherein the polymer has a molecular weight of about 30,000.

31. The process according to claim 23, wherein the polyhydroxyether is a condensation polymer derived from a bis phenol-A(2,2-bis p-hydroxy phenyl)propane and epichlorohydrin having the structural formula:

32. The process according to claim 26, wherein the degree of polymerization is greater than 80.

* * * * *